(12) United States Patent
Miyamoto (10) Patent No.: US 8,628,338 B2
(45) Date of Patent: Jan. 14, 2014

(54) PRINTED BOARD, AND CAR-MOUNTED ELECTRIC CONNECTION BOX CONTAINING THE PRINTED BOARD

(75) Inventor: Takashi Miyamoto, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 215 days.

(21) Appl. No.: 13/125,741

(22) PCT Filed: Jan. 30, 2009

(86) PCT No.: PCT/JP2009/051635
§ 371 (c)(1),
(2), (4) Date: Apr. 22, 2011

(87) PCT Pub. No.: WO2010/050247
PCT Pub. Date: May 6, 2010

(65) Prior Publication Data
US 2011/0201216 A1     Aug. 18, 2011

(30) Foreign Application Priority Data
Oct. 28, 2008    (JP) ................................. 2008-277486

(51) Int. Cl.
H01R 12/00     (2006.01)
(52) U.S. Cl.
USPC ........................................................ 439/76.2
(58) Field of Classification Search
USPC ................................................. 439/76.2, 949
See application file for complete search history.

(56) References Cited

U.S. PATENT DOCUMENTS

| | | | |
|---|---|---|---|
| 5,797,757 A | 8/1998 | Aoki | |
| 6,524,117 B1 | 2/2003 | Murakami et al. | |
| 7,784,179 B2 * | 8/2010 | Takeuchi et al. | 29/876 |
| 7,950,930 B2 * | 5/2011 | Yoshida et al. | 439/76.2 |
| 7,955,133 B2 * | 6/2011 | Scheele et al. | 439/620.27 |
| 2009/0269951 A1 * | 10/2009 | Scheele et al. | 439/76.2 |

FOREIGN PATENT DOCUMENTS

| | | |
|---|---|---|
| JP | U-3-39263 | 4/1991 |
| JP | A-9-139264 | 5/1997 |
| JP | A-2001-102113 | 4/2001 |
| JP | A-2002-261470 | 9/2002 |
| JP | A-2003-208939 | 7/2003 |
| JP | A-2006-6052 | 1/2006 |

OTHER PUBLICATIONS

Feb. 24, 2009 International Search Report issued in PCT/JP2009/051635 (with translation).

* cited by examiner

*Primary Examiner* — Neil Abrams
*Assistant Examiner* — Travis Chambers
(74) *Attorney, Agent, or Firm* — Oliff & Berridge, PLC (57) ABSTRACT

To reduce the number of terminals that protrude from a printed board and to lower a cost in production of the base. A printed board including an electrical junction unit provided with a set of terminals soldered on printed boards. The set of terminals comprise first type terminals each having a small sectional area and second type terminals each having a sectional area greater than that of each of the first type terminals. The electrical junction unit is any one of only the first type terminals, only the second type terminals, and a combination of the first and second type terminals. The first type terminals are inserted into and protrude from through-holes in a base and are soldered on the printed boards. The second type terminals are soldered on the printed boards without using the base.

8 Claims, 8 Drawing Sheets

PRINTED BOARD, AND CAR-MOUNTED ELECTRIC CONNECTION BOX CONTAINING THE PRINTED BOARD

BACKGROUND

The present application is the national phase of PCT/JP2009/051635, filed Jan. 30, 2009, which claims priority to Japanese Patent Application No. 2008-277486, filed Oct. 28, 2008.

The exemplary embodiments described herein detail for illustrative purposes and are subject to many variations in structure and design. It should be emphasized, however, that the present invention is not limited to a particularly disclosed embodiment shown or described. It is understood that various omissions and substitutions of equivalents are contemplated as circumstances may suggest or render expedient, but these are intended to cover the application or implementation without departing from the spirit or scope of the claims of the present invention. Also, it is to be understood that the phraseology and terminology used herein is for the purpose of description and should not be regarded as limiting. The terms "an" and "an" herein do not denote a limitation of quantity, but rather denote the presence of at least one of the referenced item. This disclosure generally relates to a printed board, and more particularly relates to a printed board to be contained in an electrical junction box to be mounted on a motor vehicle or the like. Disclosed embodiments can reduce the number of holder for supporting terminals that are soldered on and protrude from the printed board.

An electrical junction box to be mounted on a motor vehicle contains circuit units that include printed boards and are laminated on one another in a high density. In order to connect a conductor on the printed board to an external circuit and/or an internal circuit, terminals are soldered on the printed board, to be connected to the conductor and the terminals protrude from the printed board. These terminals are inserted into and protrude from terminal apertures in a connector containing section, a fuse containing section, and/or a relay containing section provided in the electrical junction box to be connected to a mating connector, a fuse, and/or a relay. Alternatively, the terminals protrude into a connector housing mounted on the printed board and the connector housing is coupled to a mating connector housing to connect the terminals to each other.

Figure 11A:
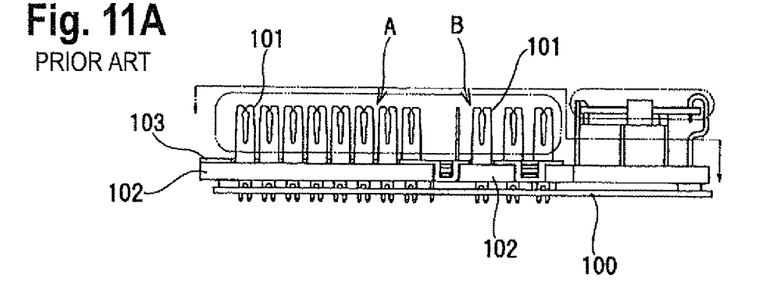
FIGS. 11A to 11C show prior art terminals in a conventional electrical junction box.
Figure 11B:
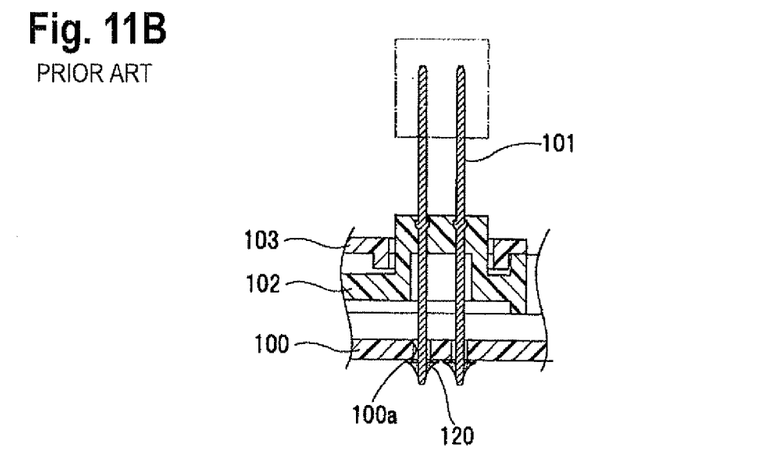
Figure 11C:
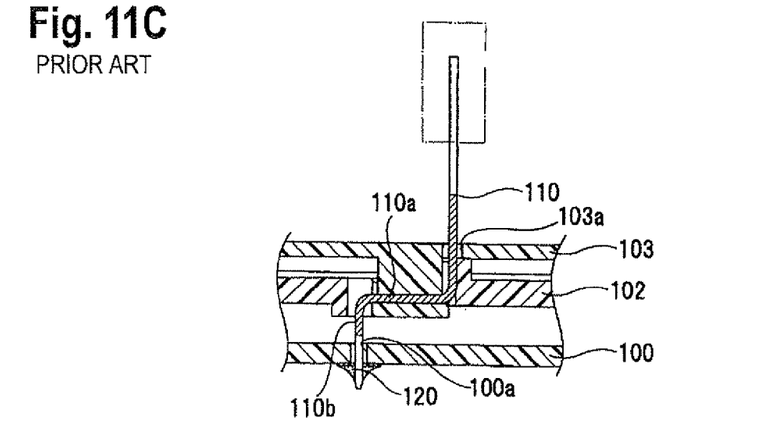

For example, a method for attaching terminals to a printed board has been disclosed in JP 2003-208939A (Patent Document 1). As shown in FIGS. 11A to 11C, connector units A, B, . . . are soldered on a printed boar 100. In each of the connector units A, B, . . . a lower end of each of a plurality of terminals 101 is inserted into and is soldered in each terminal aperture in the printed board 100 to stand up from the printed board 100. An intermediate portion of each standing terminal 101 is inserted into a holding member including a terminal plate 102 and a plate cover 103 so as to be held in the holding member. The terminal plate 102 and plate cover 103 are provided on the respective connector units.

As shown in FIG. 11B, each terminal 101 is a flat plate-like shape in a vertical direction. A lower end of the terminal 101 is inserted into a terminal aperture 100a in the printed board 100 and is fixed on the board 100 by a solder 120 so as to be connected to a conductor on the printed board 100.

FIG. 11C shows a crank-like terminal 110. The crank-like terminal 110 is inserted into a terminal aperture 103a in a terminal plate cover 103 in a vertical direction, then the terminal 110 is bent in a horizontal direction to form a horizontal portion 110a. The horizontal portion 110a is supported on the terminal plate 102. A distal end of the horizontal portion 110a is bent downward to form a downward bent portion 110b. The downward bent portion 110b is inserted into a terminal aperture 100a in a plate board 100 in a vertical direction and is secured to the plate board 100 by a solder 120 to be connected to the conductor on the plate board 100.

Patent Document 1: JP 2003-208939A

SUMMARY

In the electrical junction box disclosed in Patent Document 1, in the case where each terminal 101 is formed into either a straight flat plate-like configuration or a crank-like configuration, the terminal plates 102 and plate covers 103 are provided on the respective connector units. If the number of terminals on the connector units and the number of the connector units provided with the terminals having different shapes increase, it is necessary to prepare many terminal plates and plate covers for the connector units. This will increase a cost for a die, thereby increasing a cost in production.

As described above, in the case where the terminal plate 102 and plate cover 103 that involve a high cost are not used, there is a problem that a downward load applied to each of straight terminals will cause cracks in the soldered portion when the straight terminals are coupled to mating connectors. Furthermore, there is a problem that a terminal having a square or rectangular shape in cross section is likely to rotate in a terminal aperture upon soldering. Accordingly, it is necessary to provide a holding member for holding an intermediate portion of the terminal.

On the other hand, as shown in FIG. 11C, if the terminal plate 102 holds the horizontal bent portion 110a of the crank-like terminal 110, the horizontal bent portion 110a can bear a downward load, thereby preventing the soldered fixing portion 110b from cracking. However, there is a problem that the terminal plates 102 and plate covers 103 are required and this will increase a cost and will require time and effort in an assembling work.

In view of the above problems, an object of the preferred embodiments is to lower a cost for a printed board by judging whether or not a holding member (a base) is necessary in accordance with a shape of a terminal that is soldered on a printed board so as to protrude from the board, by providing no holding member if the holding member is not required, and by carrying out a common use of the holding member.

In order to solve the above problems, a printed board in accordance with the preferred embodiment includes an electrical junction unit provided with a set of terminals soldered on the printed board. The set of terminals comprise first type terminals each having a small sectional area and second type terminals each having a sectional area greater than that of each of the first type terminals. The electrical junction unit is formed by any one of only the first type terminals, only the second type terminals, and a combination of the first and second type terminals. The first type terminals are inserted into through-holes in a base to protrude from the through-holes and are soldered on the printed board. The second type terminals are soldered on the printed board without using the base.

As described above, in the printed board of the preferred embodiment, terminals to be soldered on and to protrude from the printed board are divided into first type terminals and second type terminals. Each of the first type terminals has a small cross section, that is, so-called a slender pin-like configuration. The first type terminals are likely to be deformed by a load caused when the first type terminals are connected to a mating electrical junction unit. Accordingly, the base is provided for the first type terminals. Since lower ends of the first type terminals are inserted into the through-holes in the base to be held in the base, it is possible to prevent the first type terminals from being deformed upon loading and to maintain the first type terminals in vertical positions with respect to the printed board.

On the other hand, each of the second type terminals has the sectional area greater than that of each of the first type terminals. The second type terminals are hardly deformed when they are connected to a mating electrical junction unit. Accordingly, it is not necessary to provide the base for the second type terminals. This will decrease the number of the bases.

Accordingly, the base is provided on the electrical junction unit including only the first type terminals to hold all of the first type terminals. In the electrical junction unit including a combination of the first and second type terminals, only the first type terminals are supported on the base and the second type terminals are not held on the base. There is a part for supporting the first type terminals by the base and a part for directly supporting the second type terminals without using the base in a single electrical junction unit.

The base is not provided on the electrical junction unit including only the second type terminals, Thus, since only the first type terminals to be soldered on the printed board and protrude from the printed board are supported by the base and the second type terminals to be soldered on the printed board are not supported by the base, it is possible to reduce the number of the bases, to lower a cost for parts, and to reduce time and effort for attaching the bases to the printed board.

The printed board is provided with a plurality of electrical junction units each including the set of terminals. Each of the electrical junction units is connected to any one of a mating connector, a fuse and a relay.

There are only first type terminals, only second type terminals, or a combination of the first and second type terminals in the electrical junction unit that includes a connector unit to be connected to a mating connector and includes a set of the terminals.

Terminals in the electrical junction unit to be connected to the fuse and relay are only the first type terminals or only the second type terminals. Only the first type terminals are supported by the base while only the second type terminals are not supported by the base.

Each of the first type terminals is formed into a square shape in cross section that has the same thickness as the width. Each of the second type terminals is formed into a rectangular in cross section that has the same thickness as that of each of the first type terminals and a width greater than that of each of the first type terminals.

Since the first type terminals each having a square shape in cross section are likely to rotate in the terminal apertures in the printed board, the first type terminals are previously inserted into the through-holes in the base. It is possible to prevent the first type terminals from rotating in the terminal apertures in the printed board and to facilitate a soldering work, thereby enhancing precision of positioning the terminals.

On the other hand, each of the second type terminals made of a wide metal plate has the same thickness as that of each of the first type terminals and a width greater than that of each of the first type terminals. Since each of the second type terminals has a higher stiffness, it is hardly deformed by a load. Since a portion of each of the second type terminals to be soldered has a rectangular shape in cross section, each second type terminal hardly rotates in the terminal aperture in the printed board. Accordingly, it is not necessary to support the second type terminals by the base.

Preferably, the first type terminals extend straightly in a direction perpendicular to the printed board, and are inserted into terminal apertures in the printed board. Each of the second type terminals includes a main body, a flat plate-like portion bent from the main body to face toward a surface of the printed board, and a fixing portion bent from a distal end to be inserted into a terminal aperture in the printed board.

As described above, the first type terminals are inserted into the terminal apertures in the printed board while the first type terminals are supported in the through-holes in the base. The second type terminals are directly inserted into the terminal apertures in the printed board without using the base. The first and second type terminals are soldered on the printed board by blowing the solder upward. Thereafter, when the first and second type terminals are coupled to the mating terminals, a strong force will be applied to the second type terminals that have greater sizes than those of the first type terminals. Accordingly, since the second type terminals are bent upward from the printed board, the bent portions of the second type terminals can absorb a downward force, thereby preventing the soldered portions from cracking.

Preferably, a boundary part between the main body and the flat plate-like portion of each of the second type terminals contacts with the surface of the printed board. The flat plate-like portion is inclined upward from boundary part to a distal end of the flat plate-like portion to define a clearance from the surface of the printed board. The fixing portion is formed by bending the distal end of the inclined flat plate-like portion toward the surface of the printed board in a direction perpendicular to the surface.

That is, the flat plate-like portion faced to the surface of the printed board is supported on the printed board at the boundary part between the main body and the flat plate-like portion. The flat plate-like portion is spaced through the clearance apart from the surface of the printed board from the bent part to the distal end of the flat plate-portion.

Since the clearance between the flat plate-like portion and the printed board increases gradually toward the distal end of the flat plate-like portion, it is possible to prevent the soldered portion between the printed board and the second type terminals from cracking, even if the load is applied to the second type terminals upon coupling the mating terminals to the second type terminals. In addition, it is possible to prevent the terminals themselves from being damaged.

Preferably, the first type terminals constitute a single unit and are attached to the printed board by a given pitch so as to form a part or a whole of the electrical junction unit. The base, into which the first type terminals are inserted, is made of a series of common products. The series of common products are cut out to form the base in correspondence with the first type terminals arranged in series by the given pitch.

Thus, if the base for the first type terminals is made of the common product, it is not necessary to provide the base on the respective electrical junction units, thereby lowering a cost for parts.

Preferably, the first type terminals are juxtaposed in two rows each having a given pitch. The series of the common products for the base have two rows of terminal through-holes each having a given pitch, The series of the common products are provided on both sides with notches that are formed every desired pitches.

Furthermore, preferred embodiments provide an electrical junction box to be mounted on a motor vehicle and to contain any one of the printed boards described above.

As described above, in the case where the printed board of preferred embodiments include an electrical junction unit including a set of tei atinals soldered on and protruding from the printed board so as to be connected to a mating connector, a fuse, a relay, and the like, the set of terminals are divided into the first type terminals each having a slender pin-like configuration and the second type terminals each having a relatively wide flat plate-like configuration. The base for holding the terminals is attached to the first type terminals and they are disposed on the printed board. The base is not attached to the second type terminals. Thus, since it is not necessary to provide the respective electrical junction units with the bases for holding the terminals, it is possible to decrease the number of the bases and to lower a cost in production of the base.

DETAILED DESCRIPTION OF EMBODIMENTS

An exemplary apparatus for an electrical junction box is described herein. The present specification discloses the components and various exemplary methods of manufacturing the components for their application and implementation. In the following description, for purposes of explanation, numerous specific details are set forth in order to provide a thorough understanding of the disclosed electrical junction box. It will be apparent, however, to one skilled in the art, that the present method may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places of the specification are not necessarily all referring to the same embodiment.

Figure 1A:
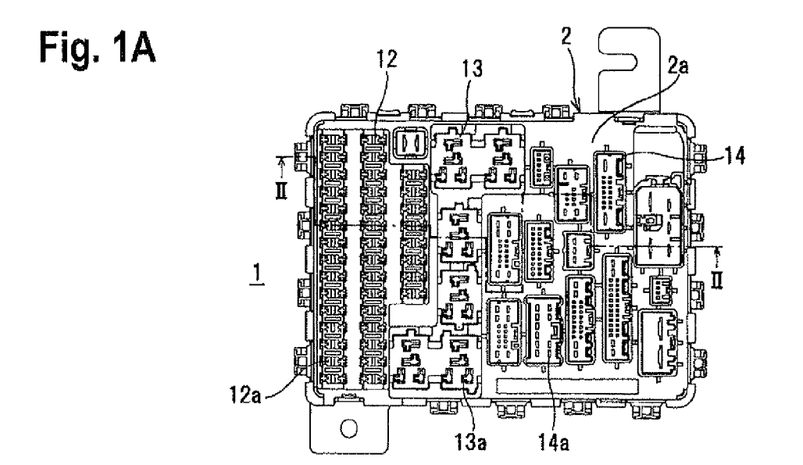
FIG. 1A is a plan view of an embodiment of an electrical junction box in accordance with a preferred embodiment.
Figure 1B:
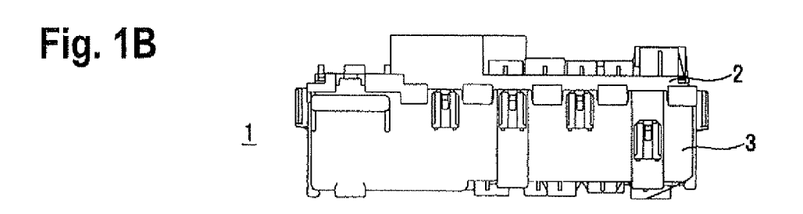
FIG. 1B is a front elevation view of the electrical junction box shown in FIG. 1A.
Figure 1C:
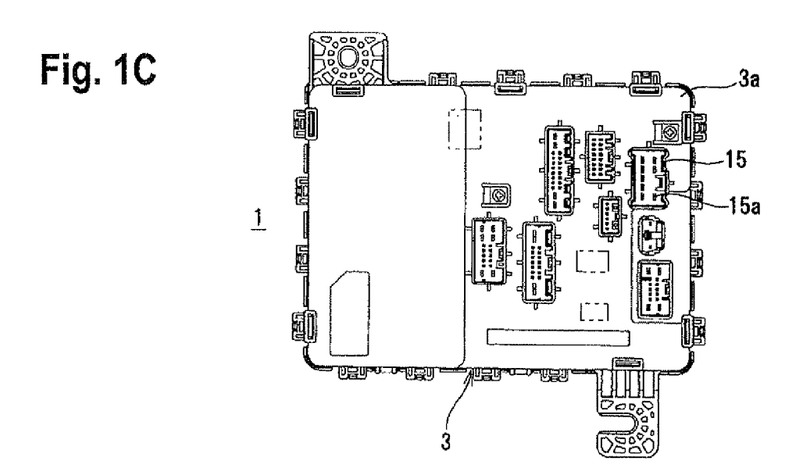
FIG. 1C is a bottom side view of the electrical junction box shown in FIG. 1A.

An electrical junction box 1 shown in FIGS. 1A to 1C is mounted on a motor vehicle, FIG. 1A is a plan view of the electrical junction box 1. FIG. 1B is a front elevation view of the electrical junction box 1 shown in FIG. 1A. FIG. 1C is a bottom side view of the electrical junction box 1 shown in FIG. 1A.

Figure 2:
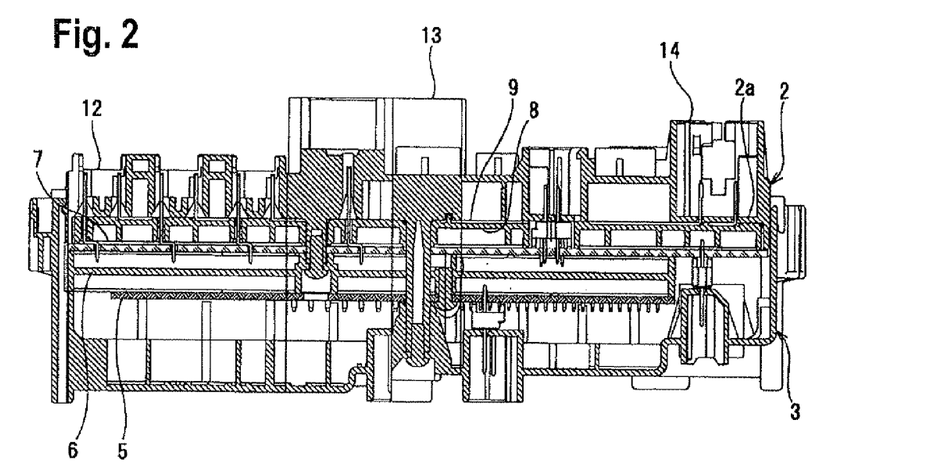
FIG. 2 is a longitudinal section view of the electrical junction box taken along lines II-II in FIG. 1A.

The electrical junction box 1 includes a casing assembly in which an upper casing 2 and a lower casing 3 are locked on each other. As shown in FIG. 2, the casing assembly contains a lower layer printed board 5, an upper layer printed board 7, and an insulating plate 6 located between the boards 5 and 7. An insulation plate 8 is disposed between the upper layer printed board 7 and an upper wall 2a of the upper casing 2. A bus bar 9 is directly secured to an inner surface of the upper wall 2a of the upper casing 2.

As shown in FIG. 1A, the upper casing 2 is provided on the upper wall 2a with fuse containing units 12, relay containing units 13, and connector containing units 14. As shown in FIG. 1C, the lower casing 3 is provided on a bottom wall 3a with connector containing units 15.

The lower layer printed board 5 and upper layer printed board 7 use multi-layer printed boards in which each layer is provided on both sides with conductors.

Figure 3:
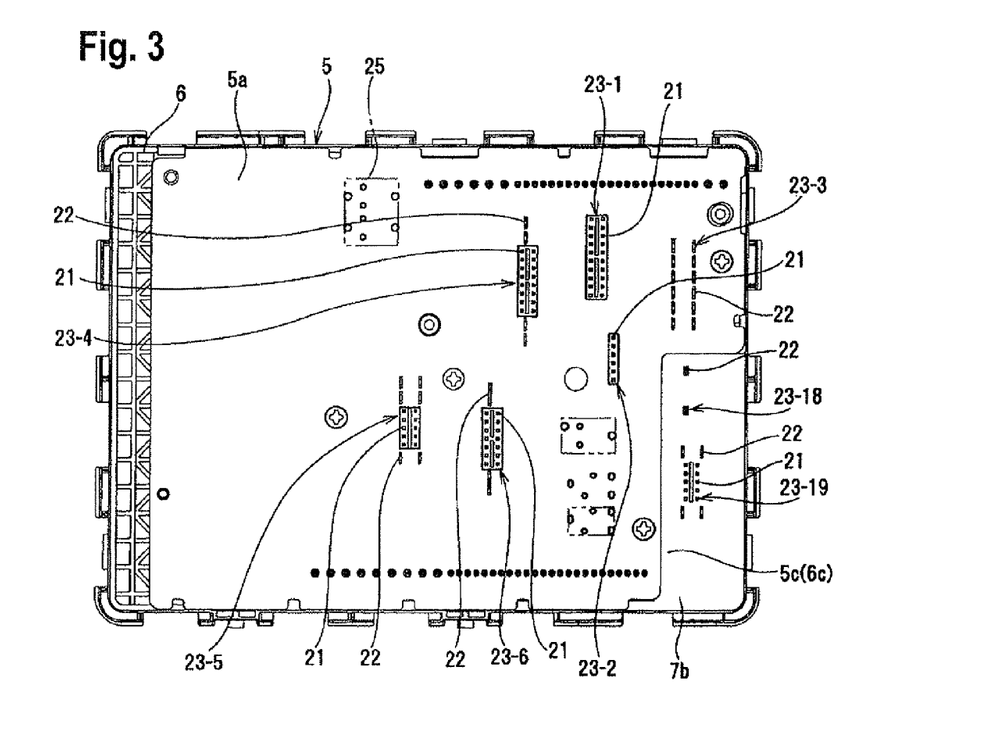
FIG. 3 is a bottom side view of a lower layer printed board.

FIG. 3 shows a bottom surface 5a of the lower layer printed board 5 opposed to the bottom wall 3a of the lower casing 3. A plurality of first type terminals 20 for coupling connectors and a plurality of second type terminals 21 for coupling connectors are soldered on the bottom surface 5a to protrude downward from the bottom surface 5a. A first connector unit 23-1 to a sixth connector unit 23-6 constitute each electrical junction unit. The first type terminals 20 and second type terminals 21 in the first connector unit 23-1 to the sixth connector unit 23-6 are inserted into terminal apertures 15a in the connector containing units 15 on the lower casing 3.

Electric and electronic components such as chip components (not shown) and board-mounted relays 26 are mounted on the bottom surface 5a of the lower layer printed board 5.

Figure 4:
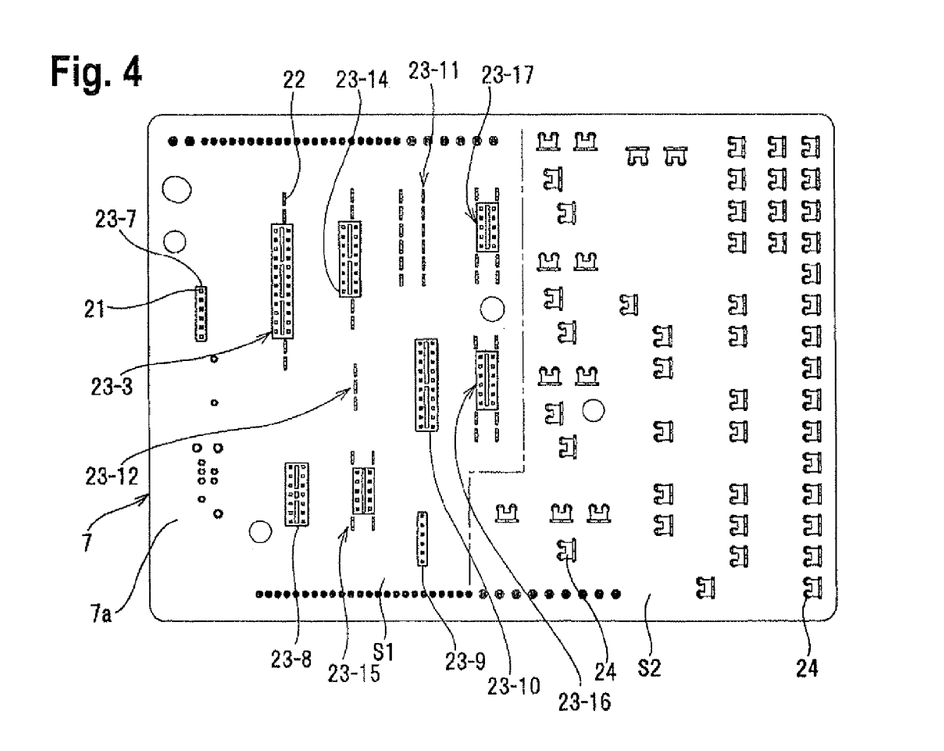
FIG. 4 is a top side view of an upper layer printed board.

FIG. 4 shows a top surface 7a of the upper layer printed board 7 at a side of the upper casing 2. The first type terminals 20 and second type terminals 21 are soldered on a first area S1 on the top surface 7a to protrude from the first area S1 while tuning fork-like terminals 24 are soldered on a second area S2 on the top surface 7a to protrude from the second area S2. The tuning fork-like terminals 24 protrude in the fuse containing units 12 and relay containing units 13 provided in the upper casing 2.

The first type terminals 20 and second type terminals 21 constitute each electrical junction unit including a seventh connector unit 23-7 to a seventeenth connector unit 23-17.

As shown in FIG. 3, cut-out portions 5c and 6c are provided continuously in the lower layer printed board 5 and insulation plate 6. The first type terminals 20 and second type terminals 21 are soldered on the bottom surface 7b of the upper layer printed board 7 opposed to the cut-out portions 5c and 6c to protrude from the bottom surface 7b. The first type terminals 20 and second type terminals 21 constitute each electrical junction unit including a eighteenth connector unit 23-18 and a nineteenth connector unit 23-19.

The first connector unit 23-1 and second connector unit 23-2 out of the first to sixth connector units 23-1 to 23-6 on the bottom surface 5b of the lower layer printed board 5 in the first to nineteenth connector units 23-1 to 23-19 that constitute each electrical junction units are the connector unit A including only the first type terminals 20. Similarly, the seventh connector unit 23-7 to the tenth connector unit 23-10 out of the seventh to seventeenth connector units 23-7 to 23-17 on the top surface 7a of the upper layer printed board 7 are the connector unit A including only the first type terminals 20.

The third connector unit 23-3 at a side of the lower layer printed board 5, the eleventh and twelfth connector units 23-11 and 23-12 at a side of a top surface of the upper layer printed board 7, and the eighteenth connector unit 23-18 at a side of the upper layer printed board 7 are the connector unit B including only the second type terminals 21.

The fourth to sixth connector units 23-4 to 23-6 at a side of the lower layer printed board 5, the thirteenth to seventeenth connector units 23-13 to 23-17 at a side of the top surface of the upper layer printed board 7, and the nineteenth connector unit 23-19 at the bottom side of the upper layer printed board 7 are the connector unit C including a combination of the first and second type terminals 20 and 21.

Hereinafter, a connector unit including only the first type terminals 20 is referred to a connector unit A. A connector unit including only the second type terminals 21 is referred to a connector unit B. A connector unit including a combination of the first and second type terminals 20 and 21 is referred to a connector unit C.

There is in the connector units A and C an arrangement in which the first type terminals 20 spaced apart from one another by a given pitch are juxtaposed in two rows and an arrangement in which the first terminals are aligned in a single row.

The first type terminals 20 have the same shapes and sizes as one another. Although the second type terminals 21 may have the same shapes as their portions (fixing portions) to be inserted into the terminal apertures in the printed board, the second type terminals 21 may have different shapes and sizes of their portions (tabs) to be connected to mating members.

Figure 5A:
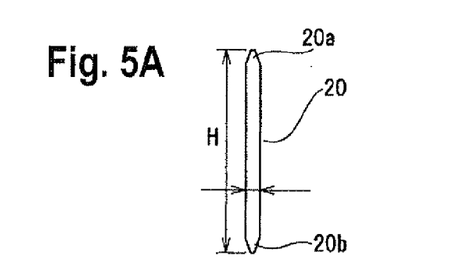
FIG. 5A is a front elevation view of a first type terminal.
Figure 5B:
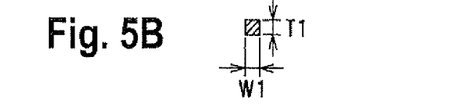
FIG. 5B is a cross section view of the first type terminal shown in FIG. 5A.
Figure 5C:
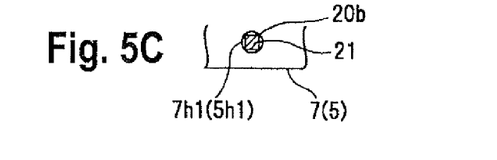
FIG. 5C is a cross section view similar to FIG. 5B, illustrating a relationship between the first type terminal and a terminal aperture in a printed board.

As shown in FIGS. 5A and 5B, each first type terminal 20 has a square shape in cross section in which a thickness T1 is the same as a width W1. The first type terminal 20 is formed into a pin-like configuration in which a main body 20b extends along a height H. As shown in FIG. 5C, when the first type terminal 20 is inserted into circular terminal apertures 7h1 and 5h1 in the upper and lower layer printed boards 7 and 5, there is a possibility that the first type terminal 20 rotates slightly in the terminal apertures 7h1 and 5h1.

As shown in FIGS. 6A to 6E, an end of the first type terminal 20 is inserted into the terminal aperture 14a or 15a in the connector containing units 14 or 15 of the upper casing 2 or lower casing 3 so as to form a tab 20a to be connected to a terminal of a mating connector. The other end of the first type terminal 20 is inserted into the terminal apertures 5h1 and 7h1 in the printed board 5 and 7 so as to form a fixing portion 20e to be soldered in the terminal apertures 5h1 and 7h1.

When the fixing portions 20e are soldered on the printed boards 5 and 7, the first type terminals 20 stand up vertically on the printed boards.

Each first type terminal 20 is inserted into the through-holes 30a in the base 30 described after, an intermediate part of the main body 20b of each first type terminal 20 is held in the base 30, and each fixing portion 20e is inserted into the terminal apertures 7h1 and 5h1.

Figure 7A:
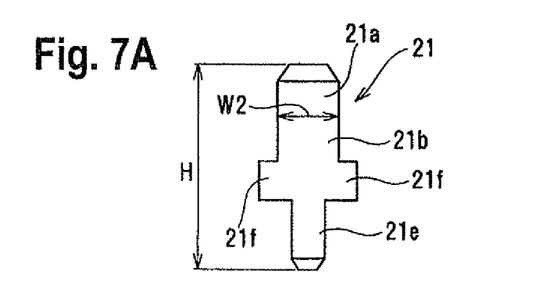
FIG. 7A is a front elevation view of a second type terminal.
Figure 7B:
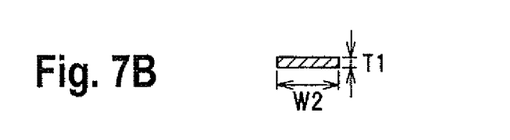
FIG. 7B is a cross section view of the second type terminal shown in FIG. 7A.

On the other hand, as shown in FIGS. 7A and 7B, each of the second type terminals 21 has the same thickness T1 as that of each of the first type terminals 20 and a width W2 greater than width W1 of each of the first type terminals 20. The second type terminal 21 has stiffness higher than that of the first type terminal 20. As shown in FIG. 7E, when the second type terminal 21 is inserted into the circular terminal apertures 7h2 and 5h2 in the upper and lower printed boards 7 and 5, the fixing portion 21e hardly rotates in the apertures, since the fixing portion 21e has a rectangular shape in cross section.

As shown in FIG. 7A, the end of the second type terminal 21 is the tab 21a to be connected to the terminal of the mating connector. The main body 21b extends along a height H of the tab 21a. The main body 21b is provided on a lower end at both sides with overhanging portions 21f so as to contact with a surface of the printed board 5 or 7. The main body 21b is provided on a substantially central part of a lower end side with a narrow fixing portion 21e to be inserted into and soldered in the terminal aperture 5h2 or 7h2 in the printed board 5 or 7.

Figure 7C:
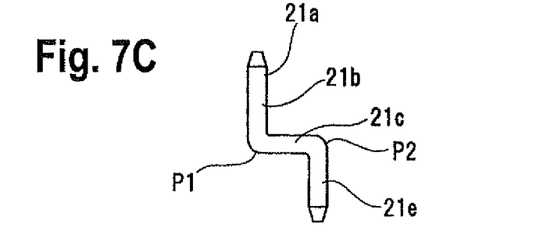
FIG. 7C is a side elevation view of an example of the second type terminal shown in FIG. 7A.

FIG. 7C shows an example of the second type terminal 21. As shown in FIG. 7C, an end of the second type terminal 21 is a flat plate-like tab 21a to be connected to a terminal of a mating connector. A main body 21b of the second terminal 21 extends from the tab 21a along a direction of a height H. The second type terminal 21 is provided at a lower end side of the main body 21b with a flat plate-like portion 21c that is disposed in parallel to a surface of the printed board so as to contact with the surface and that is continued through a first bent point P1 to the main body 21b. A narrow fixing portion 21e is provided on a substantially central part from a distal end of the flat plate-like portion 21c so as to be continued through a second bent point P2 to the flat plate-like portion 21c. The fixing portion 21e is inserted into and soldered in a terminal aperture in the printed board.

The first bent point P1 between the flat plate-like portion 21c and the main body 21b and the second bent point P2 between the flat plat-like portion 21c and the fixing portion 21b are bent by angles of about 90 degrees so that the tab 21a and fixing portion 21e stand up vertically with respect to the front and rear sides of the printed board.

Figure 7D:
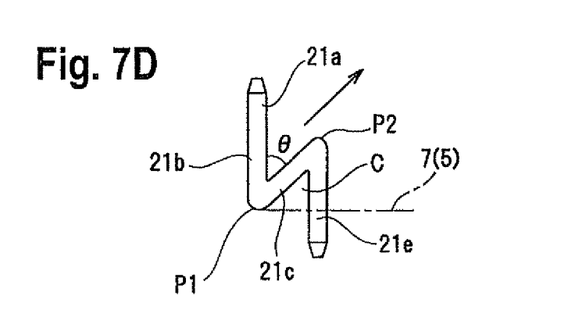
FIG. 7D is a side elevation view of another example of the second type terminal shown in FIG. 7A.
Figure 7E:
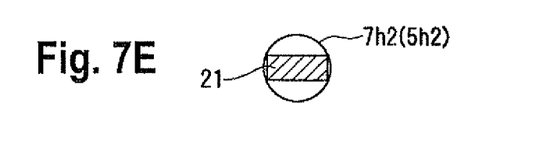
FIG. 7E is a cross section view similar to FIG. 7B, illustrating a relationship between the second type terminal and the terminal aperture in the printed board.

FIG. 7D shows another example of the second type terminal 21. As shown in FIG. 7D, the end of the second type terminal 21 is the flat plate-like tab 21a to be connected to the terminal of the mating connector. The flat plate-like portion 21c is continued through the first bent point P1 to the lower end of the main body 21b that extends along the height H of the second type terminal 21 and that is continued through the second bent point P2 to the fixing portion 21e so that the flat plate-like portion 21c is inclined upward from the surface of the printed board. The narrow fixing portion 21e is provided on a substantially central part from the distal end of the flat plate-like portion 21c so as to be continued through the bent point P2 to the flat plate-like portion 21c. The fixing portion 21e is inserted into and soldered in a terminal aperture in the printed board.

The first bent point P1 between the flat plate-like portion 21c and the main body 21b and the second bent point P2 between the flat plate-like portion 21c and the fixing portion 21e are bent by angle θ (theta) of less than 90 degrees (about 45 degrees in the present example). The flat plate-like portion 21c is inclined upward from the surface of the printed board 7 or 5 so that a clearance C (FIG. 10C) between the flat plate-like portion 21c and the surface of the printed board increases. Since the first bent point P1 contacts with the surface of the printed board 7 or 5 when the second type terminal 21 is inserted into the terminal aperture 7h2 or 5h2, the fixing portion 21e that extends downward from the distal end of the flat plate-like portion 21c is disposed in parallel to the main body 21b. Since the second type terminal 21 is inserted into the terminal aperture 7h2 or 5h2, the second type terminal 21 can be positioned on the printed board 7 or 5 to be spaced through the given clearance C apart from the printed board.

Accordingly, as shown in FIGS. 3 and 4, the base 30 is not attached to the second type terminal 21 shown in FIGS. 7A to 7E. Since the fixing portion 21e is formed into a rectangular shape in cross section and the terminal aperture, into which the fixing portion 21e is inserted, is formed into a circular shape in cross section, the fixing portion 21e hardly rotate in the terminal aperture in comparison with the case where the fixing portion 20e is formed into the square shape in cross section and the terminal aperture is formed into the circular shape in cross section. Accordingly, it is not necessary to provide the base for restraining the terminal from rotating in the terminal aperture.

In the case where a mating electrical component (not shown) such as a relay, a fuse, or a connector is coupled to the tab 21a of the second type terminal 21 that has a width relatively greater than that of the tab 20a of the first type terminal 20, a stress caused upon coupling is transmitted to the soldered portion and there is a possibility that cracks will be caused in the soldered portion. However, the overhanging portions 21f and flat plate-portion 21c can disperse the stress. The configuration shown in FIG. 7D will be most preferable in view of stress dispersion.

It is possible to freely set a location and a height of each overhanging portion 21f. A width of the flat plate-like portion 21c may not be the same as that of the main body 21b. A width of the fixing portion 21e can be set freely so long as the width of the fixing portion 21e is smaller than that of the main body 21b and the portion 21e has a rectangular shape in cross section. It is not necessary to provide the main body on a central part of the distal end with the fixing portion 21c. A position of the fixing portion 21e can be freely altered.

As described above, the base 30 is attached to the first type terminals 20 while the base 30 is not attached to the second type terminals 21.

Figure 6A:
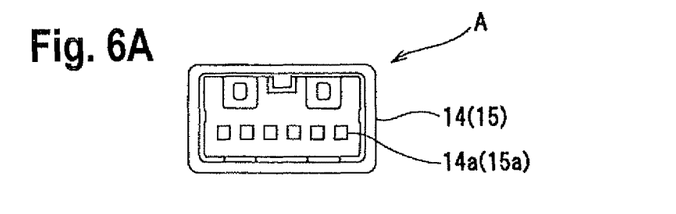
FIG. 6A is a plan view of a connector containing section, illustrating a connector unit A including only the first type terminals.
Figure 6B:
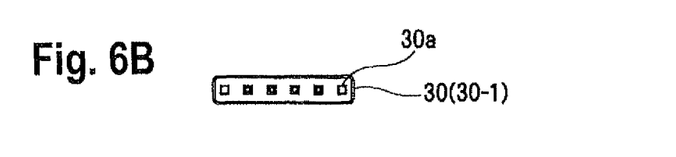
FIG. 6B is a plan view of a base of the connector containing section.
Figure 6C:
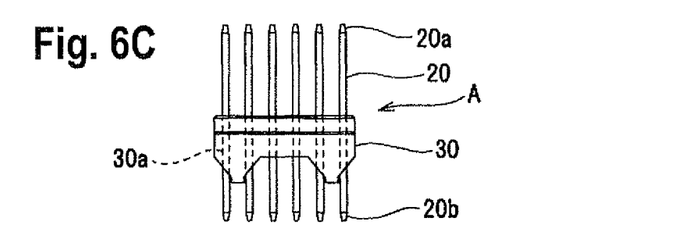
FIG. 6C is a front elevation view of the connector unit A, illustrating the first type terminals that are inserted into the base.
Figure 6D:
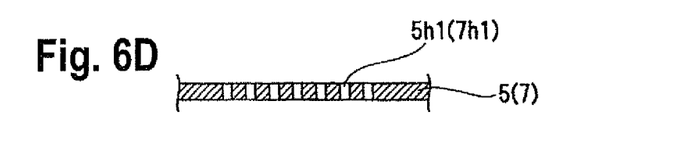
FIG. 6D is a longitudinal section view of a part of a printed board in which the terminal apertures for the first type terminals are provided.
Figure 6E:
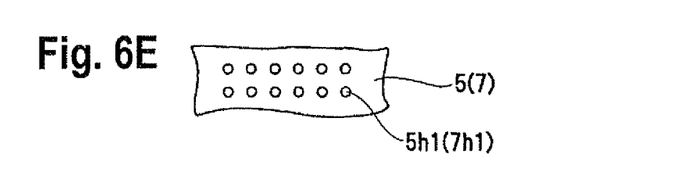
FIG. 6E is a plan view of the printed board, illustrating the terminal apertures in the printed board.

Thus, as shown in FIGS. 6B and 6C, in the connector unit A comprising only the first type terminals 20, the first type terminals 20 are inserted into the single base 30 so as to be supported in the base 30.

As shown in FIGS. 8A to 8E, in the connector unit C comprising the combination of the first and second type terminals 20 and 21, the first type terminals 20 are inserted into the single base 30 in series to be supported in the base 30 while the second type terminals 21 are arranged on both sides or one side of the base 30 (without using the base 30) and are soldered on the printed boards 5 and 7 so as to stand up from the printed boards 5 and 7.

The base 30 is provided with through-holes 30a spaced apart from one another by a given pitch so that the first type terminals 20 are inserted into the through-holes 30a. There is a first type arrangement (30-1) shown in FIG. 6B in which the through-holes 30a are provided in a single row and a second type arrangement (30-2) shown in FIG. 8B in which the through-holes 30a are provided in two rows.

Figure 8A:
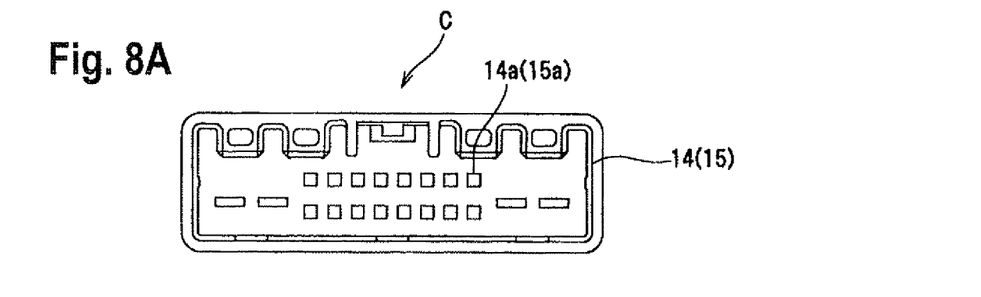
FIG. 8A is a plan view of a connector containing section, illustrating a connector unit C including a combination of the first and second type terminals.
Figure 8B:
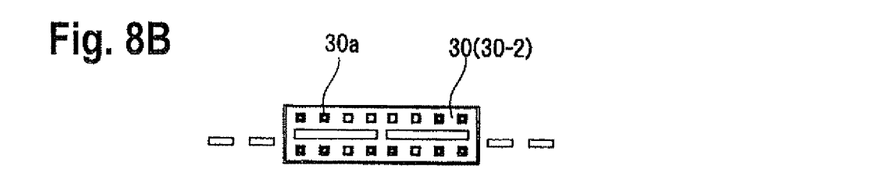
FIG. 8B is a plan view of a base of the connector containing section.
Figure 8C:
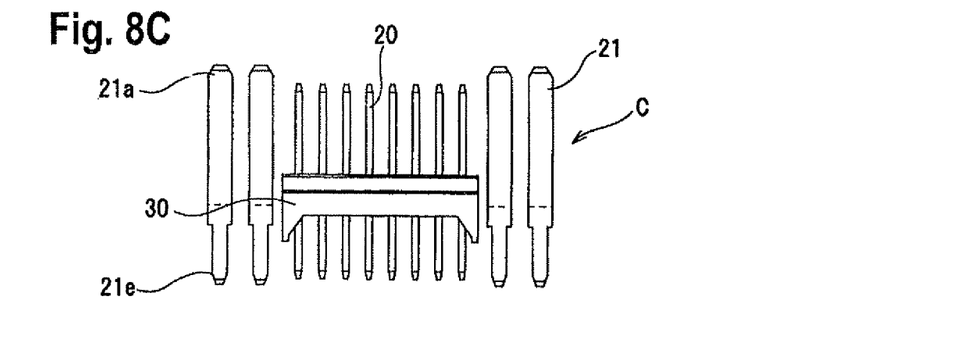
FIG. 8C is a front elevation view of the connector unit C, illustrating the first type terminals which are inserted into the base.
Figure 8D:
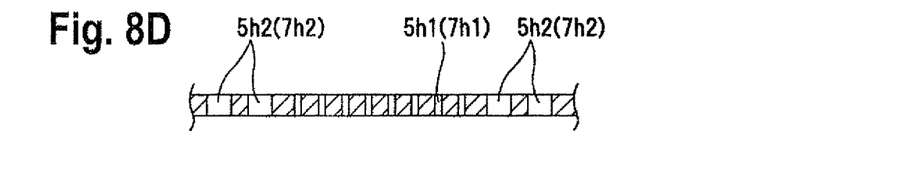
FIG. 8D is a longitudinal section view of a part of the printed board provided with terminal apertures.
Figure 8E:
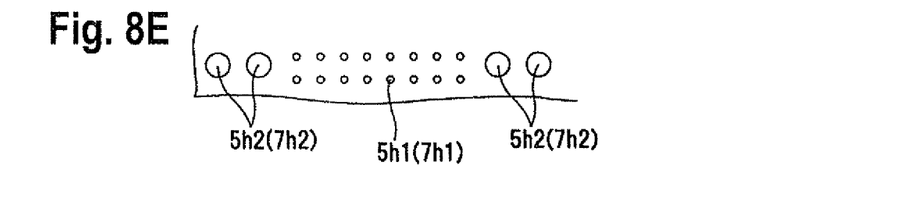
FIG. 8E is a plan view of the printed board provided with terminal apertures.

Each through-hole 30a in the base 30 is formed into a square shape in cross section in correspondence with the shape in cross section of the first type terminal 20. When each first type terminal 20 is inserted into the through-hole 30a, the first type terminal 20 can be prevented from rotating in the through-hole 30a.

Before the first type terminals 20 are inserted into the terminal apertures 7h1 and 5h1 in the upper and lower layer printed boards 7 and 5, the first type terminals are previously inserted into the base 30. After the first type terminals 20 are attached to the base 30, the fixing portions 20b at the lower ends of the terminals 20 are inserted into and are soldered in the terminal apertures 7h1 and 5h1.

In the connector unit C including the combination of the first and second type terminals 20 and 21 shown in FIGS. 8A to 8E, a plurality of second type terminals 21 are arranged on both sides of a plurality of first type terminals 20. The first and second type terminals 20 and 21 are spaced apart from one another by given pitches, respectively. The first type terminals 20 are arranged in two rows. The first type terminals 20 located at an intermediate position are inserted into the through-holes 30a in the base 30 and the fixing portions 20e of the terminals 20 are inserted into the terminal apertures 7h1 and 5h1 in the upper and lower layer printed boards 7 and 5, as is the case with the connector unit A. The second type terminals 21 located at both sides of the first type terminals 20 do not use the base 30 and the fixing portions 21e of the second type terminals 21 are inserted into and are soldered in the terminal apertures 7h1 and 5h1 in the upper and lower layer printed boards 7 and 5, as is the case with the connector unit B.

Figure 9A:
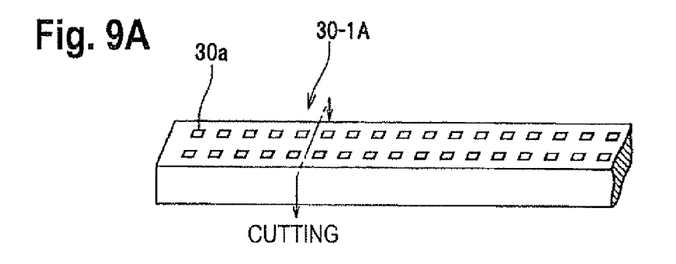
FIG. 9A is a perspective view of a series of bases as a continuously molded product.
Figure 9B:
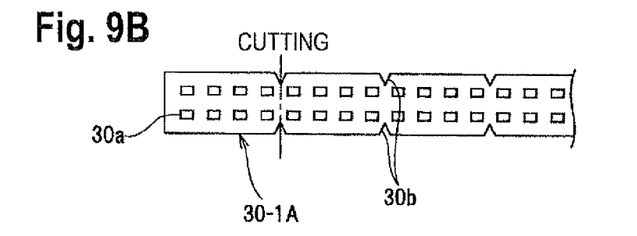
FIG. 9B is a plan view of an alteration of the series of bases.

As shown in FIGS. 9A and 9B, the first and second bases 30 (30-1 and 30-2) that are used in the connector units A and C are provided with through-holes 30a that have rectangular shapes in cross section and are arranged in two rows (or a single row) in which the through-holes 30a are spaced apart from one another by a given pitch. A continuously molded product 30-1A produced by a extruding process forms serial bases 30. The continuously molded product 30-1A is cut out at a desired position in correspondence with the number of the first type terminals 20 in a row direction in the connector units A and C. That is, the base 30 is not produced for the respective connector units A and C but the base 30 is formed by cutting out the continuously molded product that constitutes a common part.

As shown in FIG. 9B, the continuously molded product 30-1A may be previously provided on its both sides at a given pitch with V-shaped notches 30b so that the bases 30 can be formed. Since the number of the first type terminals 20 to be arranged in the connector units A and C is constant in many cases, it is possible to precisely cut out the base from the continuously molded product by using the V-shaped notches 30b as reference points.

Although FIGS. 9A and 9B show an example of two rows of the through-holes 30a, a continuously molded product provided with a single row of the through-holes 30a may be previously prepared.

Figures 10A, 10B:
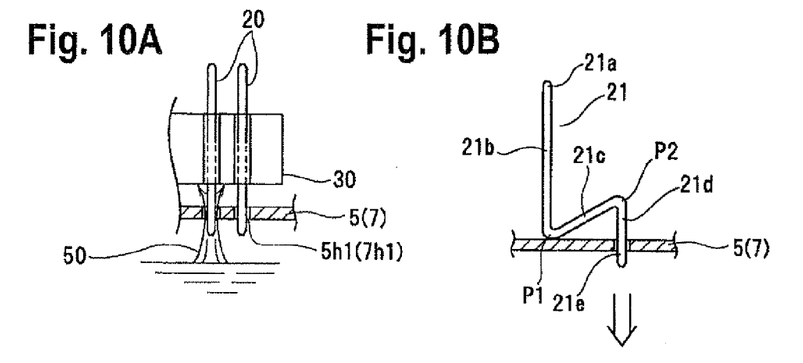
FIG. 10A is an explanatory view of a flow soldering process onto the first type terminals.
FIGS. 10B and 10C are explanatory view of a flow soldering process onto the second type terminals.
Figure 10C:
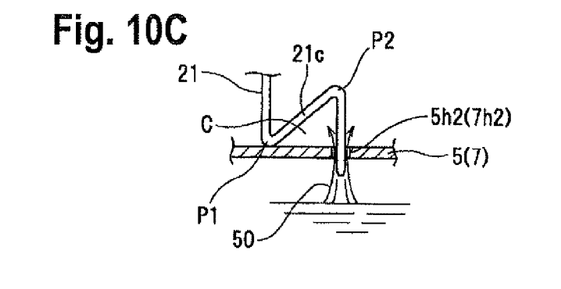

As shown in FIGS. 10A to 10C, electronic components including the first and second type terminals 20 and 21 to be soldered on the upper and lower layer printed boards 7 and 5 are treated by a flow soldering process of a solder 50.

Before carrying out the flow soldering process, as shown in FIG. 10A, the first type terminals 20 are inserted into the through-holes 30a in the base 30 and are inserted into the terminal apertures 5h1 in the lower layer printed board 5 (or the terminal apertures 7h1 in the upper layer printed board 7). Since the first type terminals 20 are inserted into the terminal apertures 5h1 (7h1) in the lower layer printed board 5 (7) while the base 30 prevents the first type terminals 20 from rotating in the base 30, the first type terminals 20 can be prevented from rotating in the terminal apertures 5h1 (7h1).

On the other hand, as shown in FIG. 10B, the second type terminals 21 are held by a terminal holder (not shown) and the lower ends of second bent portions 21d of the second type terminals 21 are inserted into the terminal apertures 5h2 (7h2). Although the second type terminals 21 are not supported by the base 30, the second type terminals 21 can be positioned in the terminal apertures 5h2 (7h2) without causing any rotation of the second type terminals, since the second type terminals 21 have rectangular shapes in cross section.

Under this condition, a flow solder is blown upward so that the molten solder 50 flows into the terminal apertures 5h1 and 5h2 (7h1 and 7h2). Thus, the first and second type terminals 20 and 21 are soldered on inner peripheral surfaces of the terminal apertures 5h1 and 5h2 (7h1 and 7h2).

Although the solder 50 blown upward to the terminal apertures 5h2 (7h2), into which the second type terminals 21 are inserted, is adhered to the upper ends of the fixing portions 21e, the fixing portions 21e are spaced apart from the lower layer printed board 5 (7) by the slant flat plate-like portions (first bent portion) 21c and the second type terminals 21 are formed into the substantially N-shaped configurations. Consequently, although a load is applied to the second type terminals 21 when the second type terminals 21 are coupled to the mating terminals, the load will escape from the second type terminals 21 in a direction shown by an arrow in FIG. 7D so that the load can be absorbed. Accordingly, it is possible to prevent the solder on the second type terminals 21 from cracking, even if the base 30 does not hold the second type terminals 21. It is also possible to prevent a boundary portion between the main body 21b and the flat plate-like portion (first bent portion) 21c and between the flat plate-like portions 21c and the fixing portion 21e (or the second bent portion 21d) from being broken.

As shown in FIG. 2, the upper and lower printed boards 7 and 5, on which the first and second type terminals 20 and 21 are soldered, are contained in the casing assembly including the upper and lower casings 2 and 3 to assemble the electrical junction box 1. Upon assembling, the upper and lower layer printed boards 7 and 5 may be assembled in sequence in the casing assembly. Alternatively, after the upper and lower layer printed boards 7 and 5 are previously secured to top and bottom surfaces of the insulation plate 6 to integrate each other, they may be contained in the casing assembly.

Under an assembled condition, the tabs 20a of the first type terminals 20 and the tabs 21a of the second type terminals 21 on the connector units A, B, and C protrude into terminal apertures in the connector containing units 14 and 15 in the opposed upper and lower casings 2 and 3, respectively.

In the electrical junction box 1 constructed above, when the mating connectors are coupled to the connector containing section 14 on the upper casing 2 and to the connector containing section 15 on the lower casing 3, a load is applied to the first and second type terminals 20 and 21. However, since the first type terminals 20 are held by the base 30, the first type terminals 20 are not deformed by the load. Since the load applied to the second type terminals 21 can be absorbed by the flat plate-like portions (first bent portion) 21c, any cracks in the solder or any damages in the terminals are not caused.

The first type terminals 20 to be soldered on the upper and lower layer printed boards 7 and 5 are held by the base 30. However, since the base 30 is not mounted on the second type terminals 21, it is possible to greatly reduce the number of bases. If the base 30 is formed by cutting out the continuously molded product 30-1A so as to make common components, as described above, it is possible to greatly reduce a cost in production in comparison with the case of forming the base 30 one by one.

It should be noted that the present invention is not limited to the above embodiments. The bases 30 may be produced one by one. In this case, since the base 30 is attached to only the first type terminals 20 and the base 30 is not attached to the second type terminals 21, it is possible to decrease the number of the bases 30, thereby lowering a cost in production.

In the present embodiments, the soldered terminals that protrude from the printed boards constitute the connector units to be coupled to the mating connectors. However, the tuning fork-like terminals 24 to be connected to a fuse or a relay may be formed into the same configurations as those of the second type terminals.

The foregoing descriptions of specific embodiments have been presented for purposes of illustration and description. They are not intended to be exhaustive or to limit the invention to the precise forms disclosed, and obviously many modifications and variations are possible in light of the above teaching. The embodiments were chosen and described in order to best explain principles and practical applications of the invention, and to thereby enable others skilled in the art to best utilize the invention and various embodiments with various modifications as are suited to the particular use contemplated. It is understood that various omissions and substitutions of equivalents are contemplated as circumstances may suggest or render expedient, but these are intended to cover the application or implementation without departing from the spirit or scope of the claims of the present invention.

The invention claimed is:

1. A printed board comprising:
   an electrical junction unit provided with a set of terminals soldered on said printed board;
   said set of terminals comprising first type terminals each having a small sectional area and second type terminals each having a sectional area greater than that of each of said first type terminals;
   said electrical junction unit being formed by any one of only said first type terminals, only said second type terminals, and a combination of said first and second type terminals; and
   said first type terminals being inserted into through-holes in a base to protrude from said through-holes and being soldered on said printed board, and said second type terminals being soldered on said printed board without being inserted into through-holes in said base, wherein
   each of said first type terminals is formed into a square shape in cross section that has a thickness and width equal to each other, each of said second type terminals is formed into a rectangular in cross section that has a thickness equal to the thickness of each of said first type terminals and a width greater than the width of each of said first type terminals;
   said first type terminals extend straightly in a direction perpendicular to said printed board, and are inserted into terminal apertures in said printed board; and
   each of said second type terminals includes a main body, a flat plate-like portion bent from said main body to face toward a surface of said printed board, and a fixing portion bent from a distal end to be inserted into a terminal aperture in said printed board.

2. A printed board according to claim 1, wherein said first type terminals constitute a single unit and are attached to said printed board by a given pitch so as to form a part or a whole of said electrical junction unit; and said base, into which said first type terminals are inserted, is made of a series of common products, and said series of common products are cut out to form said base in correspondence with said first type terminals arranged in series by said given pitch.

3. An electrical junction box to be mounted on a motor vehicle, said box containing said printed board according to claim 1.

4. A printed board comprising:

an electrical junction unit provided with a set of terminals soldered on said printed board;

said set of terminals comprising first type terminals each having a small sectional area and second type terminals each having a sectional area greater than that of each of said first type terminals;

said electrical junction unit being formed by any one of only said first type terminals, only said second type terminals, and a combination of said first and second type terminals; and said first type terminals being inserted into through-holes in a base to protrude from said through-holes and being soldered on said printed board, and said second type terminals being soldered on said printed board without being inserted into through-holes in said base, wherein each of said first type terminals is formed into a square shape in cross section that has a thickness and width equal to each other, each of said second type terminals is formed into a rectangular in cross section that has a thickness equal to the thickness of each of said first type terminals and a width greater than the width of each of said first type terminals;

said first type terminals extend straightly in a direction perpendicular to said printed board, and are inserted into terminal apertures in said printed board;

each of said second type terminals includes a main body, a flat plate-like portion bent from said main body to face toward a surface of said printed board, and a fixing portion bent from a distal end to be inserted into a terminal aperture in said printed board a boundary part between said main body and said flat plate-like portion of each of said second type terminals contacts with said surface of said printed board, said flat plate-like portion is inclined upward from boundary part to a distal end of said flat plate-like portion to define a clearance from said surface of said printed board, and said fixing portion is formed by bending said distal end of said inclined flat plate-like portion toward said surface of said printed board in a direction perpendicular to said surface.

5. A printed board according to claim 4, wherein said first type terminals constitute a single unit and are attached to said printed board by a given pitch so as to form a part or a whole of said electrical junction unit; and said base, into which said first type terminals are inserted, is made of a series of common products, and said series of common products are cut out to form said base in correspondence with said first type terminals arranged in series by said given pitch.

6. An electrical junction box to be mounted on a motor vehicle, said box containing said printed board according to claim 4.

7. A printed board comprising:

an electrical junction unit provided with a set of terminals soldered on said printed board;

said set of terminals comprising first type terminals each having a small sectional area and second type terminals each having a sectional area greater than that of each of said first type terminals;

said electrical junction unit being formed by any one of only said first type terminals, only said second type terminals, and a combination of said first and second type terminals; and said first type terminals being inserted into through-holes in a base to protrude from said through-holes and being soldered on said printed board, and said second type terminals being soldered on said printed board without being inserted into through-holes in said base wherein said first type terminals constitute a single unit and are attached to said printed board by a given pitch so as to form a part or a whole of said electrical junction unit; and said base, into which said first type terminals are inserted, is made of a series of common products, and said series of common products are cut out to form said base in correspondence with said first type terminals arranged in series by said given pitch said first type terminals are juxtaposed in two rows each having a given pitch, said series of said common products for said base have two rows of terminal through-holes each having a given pitch, and said series of said common products are provided on both sides with notches that are formed every desired pitches.

8. An electrical junction box to be mounted on a motor vehicle, said box containing said printed board according to claim 7.

* * * * *